(12) United States Patent
Wang

(10) Patent No.: US 8,535,508 B2
(45) Date of Patent: Sep. 17, 2013

(54) COATING METHOD FOR FORMING PATTERN ON WORKPIECE

(75) Inventor: Chung-Pei Wang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 493 days.

(21) Appl. No.: 12/978,355

(22) Filed: Dec. 23, 2010

(65) Prior Publication Data

US 2012/0052205 A1 Mar. 1, 2012

(30) Foreign Application Priority Data

Aug. 24, 2010 (TW) ................................ 99128282 A

(51) Int. Cl.
*C25F 3/02* (2006.01)
(52) U.S. Cl.
USPC ........... 205/666; 205/119; 205/135; 427/259; 427/272
(58) Field of Classification Search
USPC .................. 205/119, 135, 666; 427/259, 272
See application file for complete search history.

(56) References Cited

U.S. PATENT DOCUMENTS

| | | | | |
|---|---|---|---|---|
| 6,280,821 B1 * | 8/2001 | Kadunce et al. | ............... | 428/157 |
| 2010/0080914 A1 * | 4/2010 | Forrest et al. | .................. | 427/259 |
| 2010/0264037 A1 * | 10/2010 | Cohen | ........................... | 205/131 |

FOREIGN PATENT DOCUMENTS

JP 63210264 A * 8/1988

* cited by examiner

*Primary Examiner* — Nicholas A Smith
(74) *Attorney, Agent, or Firm* — Altis Law Group, Inc.

(57) ABSTRACT

A coating method for forming a pattern on a workpiece is provided. First, a workpiece surface is provided. Second, a mask having a shape conforming to a predetermined pattern is provided. Next, the workpiece surface includes a first portion exposed outside and a second portion shielded by the mask. A shielding layer is formed on the exposed first portion of the workpiece surface. The mask is removed from the workpiece to expose the second portion. A coating layer over the shielding layer and the exposed second portion is formed. The coating layer consists of a first part overlaying the shielding layer and a second part overlaying the second portion. The mask is attached onto the coating layer and aligned with the second portion of the workpiece surface. The first part of the coating layer, the shielding layer, and the mask are then removed.

8 Claims, 6 Drawing Sheets

COATING METHOD FOR FORMING PATTERN ON WORKPIECE

BACKGROUND

1. Technical Field

The present disclosure relates to coating methods, and particularly to a coating method for forming a pattern on a workpiece, for example, a case of a mobile phone.

2. Description of Related Art

Metal or metal oxide coatings can be applied to a predetermined area of a workpiece by physical vapor deposition (PVD) methods or chemical vapor deposition (CVD) methods. A shielding sheet covers the non-predetermined area so the metal or metal oxide materials will only be coated on the predetermined area. However, the disadvantage of using PVD or CVD methods only is the shielding sheet is usually too thick; some metal or metal oxide coatings may be deposited on the edges of the shielding sheet and on the edges of the predetermined area. Therefore, the edges of the predetermined area may be blurred, and the thickness of the coat may not be uniform.

What is needed, therefore, is a coating method for forming pattern on workpiece, which can overcome the above shortcomings.

BRIEF DESCRIPTION OF THE DRAWINGS

Many aspects of the present coating method for forming pattern on workpiece can be better understood with reference to the following drawings. The components in the drawings are not necessarily drawn to scale, the emphasis instead being placed upon clearly illustrating the principles of the present coating method for forming patterns. Moreover, in the drawings, like reference numerals designate corresponding parts throughout the views.

DETAILED DESCRIPTION

Figure 1:
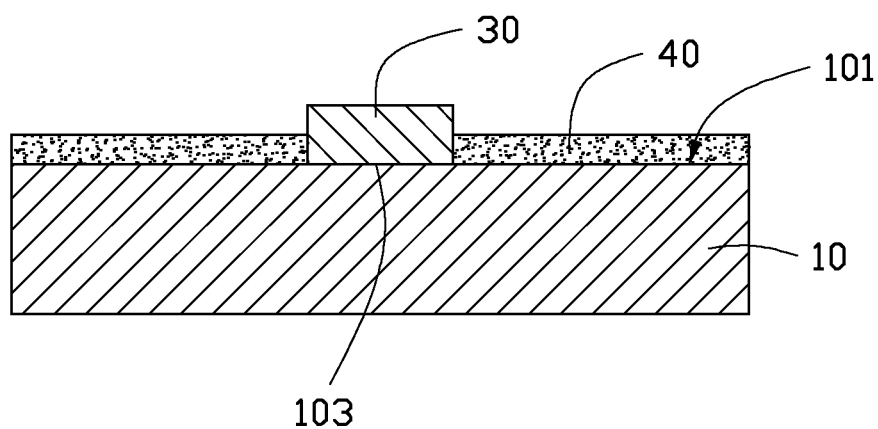
FIG. 1 is a cross-sectional view of a workpiece coated with a shielding layer, and shielded by a mask.

Referring to the FIG. 1, a workpiece 10 having an external workpiece surface 101 is subjected to a coating step. The workpiece 10 is made of ferromagnetic materials, for example iron, nickel, or cobalt, or alloy containing such ferromagnetic materials. The workpiece surface 101 is flat.

In a first step, a mask 30 is provided. The mask 30 is applied to the workpiece surface 101. The mask 30 has a shape conforming to a predetermined pattern 60 (shown in FIG. 5). The mask 30 is attached onto the workpiece surface 101; therefore, the workpiece surface includes a first portion exposed outside and a second portion 103 shielded by the mask 30. The mask 30 is made of magnetic materials, for example magnet, or permanent magnet. Because the workpiece 10 is made of ferromagnetic materials, it is easy to attach the mask 30 to the workpiece 10 firmly. The predetermined pattern 60 may be a logo, or a trademark.

In a second step, all of the surface 101 except the predetermined area 103 that has a shielding layer 40 is coated. The shielding layer 40 is made of ink, or photoresist material. In this embodiment, the workpiece 10 is dipped into a tank full of the shielding material, such as ink, or photoresist solution (not shown). The shielding layer 40 is coated over the exposed first portion of the workpiece surface 101. The shielding layer 40 provides convenience when removing the other coating layers from the workpiece surface 101.

Figure 2:
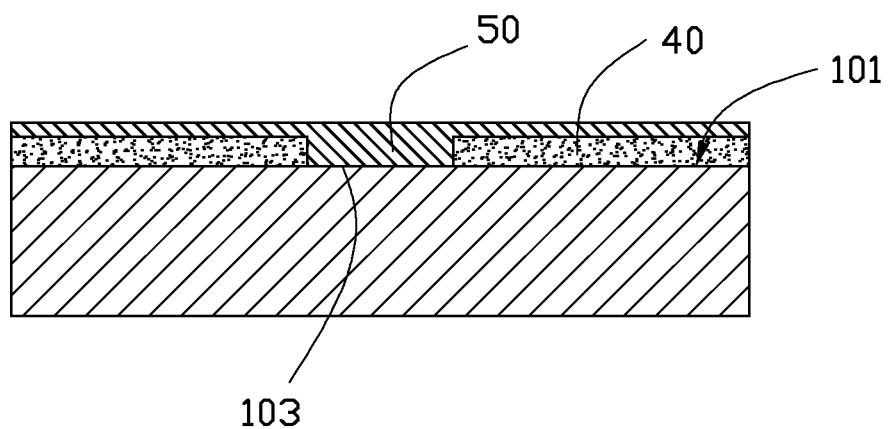
FIG. 2 is similar to FIG. 1, but showing that the workpiece is coated with a coating layer.

Referring to the FIG. 2, in a third step, the mask 30 is removed from the workpiece 10 to expose the second portion 103. The shielding layer 40 and the exposed second portion 103 is coated by a coating layer 50 using a PVD method. The coating layer 50 consists of a first part 51 overlaying the shielding layer 40 and a second part 52 overlaying the second portion 103. A thickness of the second part 52 is controlled to be substantially equal to the sum of the thicknesses of the shielding layer 40 and the thickness of the first part 51 on the shielding layer 40, that is, the coating layer 50 is uniform.

Figure 3:
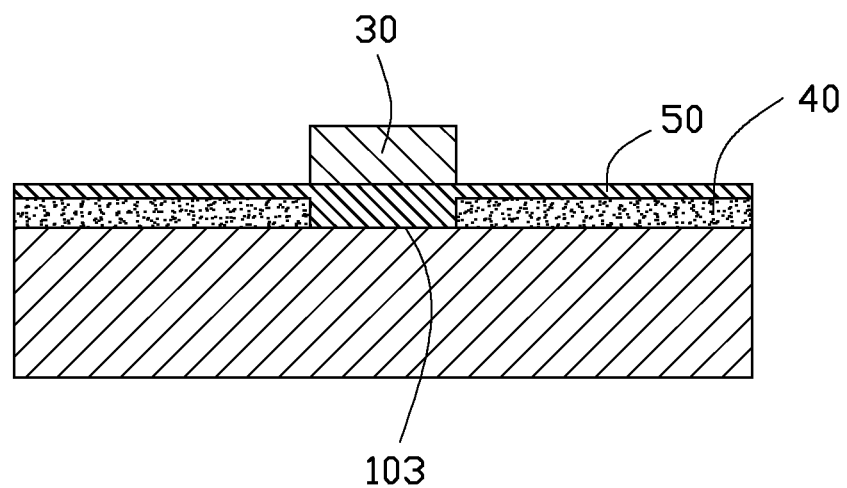
FIG. 3 is similar to FIG. 2, but showing that the workpiece is shielded by the mask.

Refer to the FIG. 3, in a fourth step, the mask 30 is attached onto the coating layer 50 and aligned with the second portion 103 of the workpiece surface 101. The first part 51 of the coating layer 50 is exposed.

Figure 4:
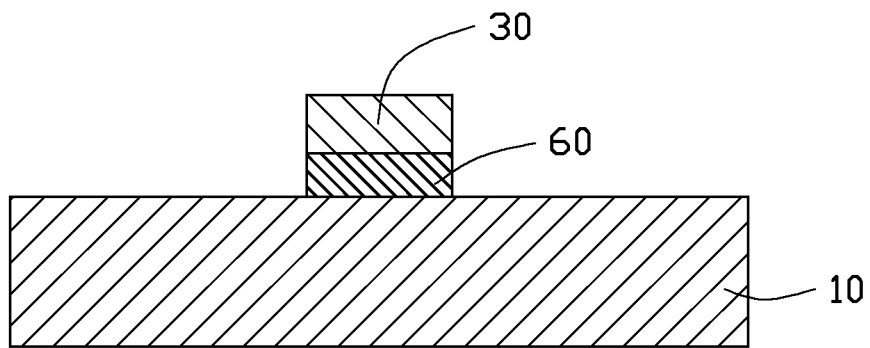
FIG. 4 is similar to FIG. 3, but showing that the shielding layer and a portion of the coating layer are removed.
Figure 5:
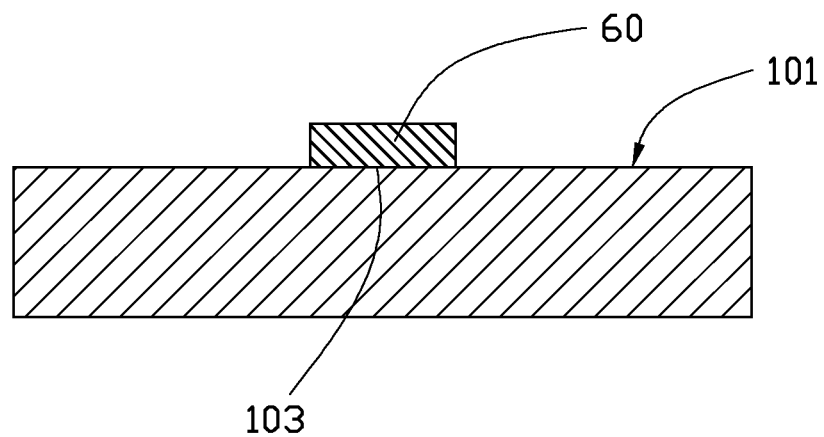
FIG. 5 is a cross-sectional view of the workpiece with a pattern formed thereon.

Refer to the FIGS. 4 and 5, in a fifth step, the first part 51 of the coating layer 50 and the shielding layer 40 is removed. The first part 51 is removed by electrochemical machining method. Because the shielding layer 40 is made of the ink or photoresist that does not react with materials used in the electrochemical machining method, the shielding layer 40 thus remains. Next, the shielding layer 40 is removed according to the properties of the material. If the shielding layer 40 is made of an ink, alkaline solution, for example sodium hydroxide (NaOH) solution, may be used to remove the shielding layer 40. The shielding layer 40 made of photoresist may be removed using a photoresist developer. Because the alkaline solution or photoresist developer is non reactive with the material of the coating layer 50, the second part 52 is kept; therefore, a predetermined pattern 60 is shown. The predetermined pattern 60 is formed actually in the step of coating the coating layer 50. The thickness of the predetermined pattern 60 is less than 2 micrometers. The edges of the predetermined pattern 60 are modified by hand if needed. Because the coating layer 50 is uniform, the predetermined pattern 60 is uniform.

Figure 6:
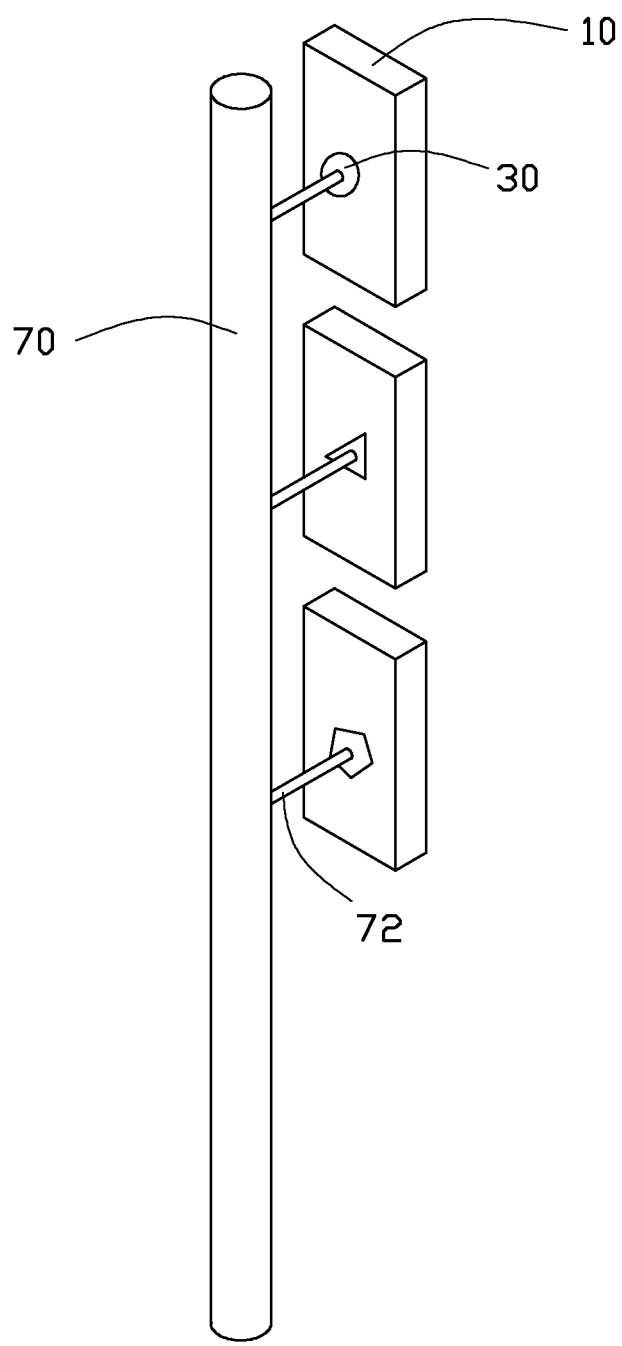
FIG. 6 is a schematic view of a mask assembly.

Referring to the FIG. 6, a mask assembly 70 is provided to shield a number of workpiece surfaces at the same time. In this embodiment, the mask assembly 70 includes a rack 71 and a number of masks mounted on the rack 71 by a number of hanging poles 72. The rack 71 is substantially a long pole made of metal. The fixed ends of each number of hanging poles 72 are connected to a surface of the rack 71. One mask 30 is fixed to a free end of one hanging poles 72. The extension direction of the hanging pole 72 is substantially perpendicular to that of the rack 71. When the second portion 103 needs to be shielded, the workpiece 10 is attached by one mask 30. When the second portion 103 does not need to be shielded, the workpiece 10 is removed from the rack 71. The rack 71 may also be configured to attach a surface that does not need to be coated in order to provide convenience while the workpiece surface 101 is being coated.

It is understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A coating method for forming a pattern on a workpiece, the method comprising:
   providing a workpiece having a workpiece surface;
   providing a mask having a shape conforming to a predetermined pattern;
   attaching the mask onto the workpiece, the workpiece surface including a first portion exposed outside and a second portion shielded by the mask;
   forming a shielding layer on the exposed first portion of the workpiece surface;
   removing the mask from the workpiece to expose the second portion;
   forming a coating layer over the shielding layer and the exposed second portion using a physical phase deposition method, the coating layer consisting of a first part overlaying the shielding layer and a second part overlaying the second portion, a thickness of the second part being substantially equal to the sum of the thicknesses of the shielding layer and the thickness of the first part on the shielding layer;
   attaching the mask onto the coating layer, the mask being aligned with the second portion of the workpiece surface;
   removing the first part of the coating layer;
   removing the shielding layer; and
   removing the mask.

2. The method according to claim 1, wherein the first part of the coating layer is removed using an electrochemical machining method.

3. The method according to claim 2, wherein the shielding layer is made of ink, and the shielding layer is removed using an alkaline solution, the alkaline solution being non-reactive with the coating layer.

4. The method according to claim 2, wherein the shielding layer is made of photoresist, and the shielding layer is removed using a photoresist developer, the photoresist developer being nonreactive with the coating layer.

5. The method according to claim 1, wherein the workpiece is made of ferromagnetic material, and the mask is made of magnetic material.

6. The method according to claim 1, wherein the coating layer is made of metal or metal oxides.

7. The method according to claim 1, wherein the shielding layer is formed by dipping the workpiece into a shielding material.

8. A coating method for forming patterns on a workpiece, the method comprising:
   providing a workpiece having a workpiece surface;
   providing a mask assembly having a rack and a plurality of masks mounted on the rack, each mask having a shape conforming to a predetermined pattern;
   attaching the masks onto the workpiece, the workpiece surface including a first portion exposed outside and second portions shielded by the masks;
   forming a shielding layer on the exposed first portion of the workpiece surface;
   removing the masks from the workpiece to expose the second portions;
   forming a coating layer over the shielding layer and the exposed second portions using a physical phase deposition method, the coating layer consisting of a first part overlaying the shielding layer and second parts overlaying the respective second portions, a thickness of each second part being substantially equal to the sum of the thicknesses of the shielding layer and the thickness of the first part on the shielding layer;
   attaching the masks onto the coating layer, the masks being aligned with the second portions of the workpiece surface;
   removing the first part of the coating layer;
   removing the shielding layer; and
   removing the mask.

* * * * *